(12) United States Patent
Sellers et al.

(10) Patent No.: US 7,368,913 B2
(45) Date of Patent: May 6, 2008

(54) APPARATUS AND METHOD OF PROVIDING FORCED AIRFLOW TO A SURFACE OF A GRADIENT COIL

(75) Inventors: Michael B. Sellers, Florence, SC (US); Robert A. Belinski, Florence, SC (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 11/428,237

(22) Filed: Jun. 30, 2006

(65) Prior Publication Data

US 2008/0001601 A1 Jan. 3, 2008

(51) Int. Cl.
*G01V 3/00* (2006.01)
(52) U.S. Cl. ...................................... 324/318
(58) Field of Classification Search ........ 324/300–322; 600/410–435
See application file for complete search history.

(56) References Cited

U.S. PATENT DOCUMENTS

| | | | | |
|---|---|---|---|---|
| 6,011,394 | A * | 1/2000 | Petropoulos et al. | 324/318 |
| 6,552,545 | B2 | 4/2003 | Kaindl et al. | |
| 6,771,072 | B2 | 8/2004 | Schuster et al. | |
| 6,812,705 | B1 * | 11/2004 | Sellers | 324/318 |
| 6,992,483 | B1 | 1/2006 | Emeric et al. | |
| 7,015,692 | B2 * | 3/2006 | Clarke et al. | 324/300 |
| 7,034,534 | B2 * | 4/2006 | Ehman et al. | 324/318 |
| 7,135,863 | B2 * | 11/2006 | Arik et al. | 324/318 |
| 7,170,292 | B2 * | 1/2007 | Doty et al. | 324/321 |
| 7,180,292 | B2 * | 2/2007 | Coughlin | 324/318 |
| 7,193,416 | B2 | 3/2007 | Harvey et al. | |
| 2002/0156595 | A1 | 10/2002 | Heldund et al. | |
| 2005/0030028 | A1 | 2/2005 | Clarke et al. | |
| 2005/0035764 | A1 | 2/2005 | Mantone et al. | |
| 2005/0104701 | A1* | 5/2005 | Huang et al. | 335/300 |
| 2005/0179512 | A1 | 8/2005 | Wyers et al. | |
| 2007/0080689 | A1 | 4/2007 | Konijn et al. | |

FOREIGN PATENT DOCUMENTS

JP 08080289 A 3/1996
JP 10225446 A 8/1998

OTHER PUBLICATIONS

GB Search Report dated Sep 28, 2007.

* cited by examiner

*Primary Examiner*—Brij Shrivastav
*Assistant Examiner*—Dixomara Vargas

(57) ABSTRACT

An apparatus for providing forced airflow to a surface of a cylindrical gradient coil in a cylindrical magnet assembly including a cylindrical magnet and a first annular gap between the gradient coil and the magnet, the gradient coil mounted inside the magnet includes a first manifold tube having an annular shape and located in the first annular gap between the gradient coil and the magnet. The first manifold tube includes at least one inlet on a first side of the first manifold tube and a plurality of outlet holes on a second side of the first manifold tube. The apparatus also includes an air source coupled to at least one inlet of the first manifold tube and configured to provide airflow to the first manifold tube. In one embodiment, a second manifold tube may be located in a second annular gap between the gradient coil and the RF coil.

18 Claims, 5 Drawing Sheets

APPARATUS AND METHOD OF PROVIDING FORCED AIRFLOW TO A SURFACE OF A GRADIENT COIL

FIELD OF THE INVENTION

The present invention relates generally to magnetic resonance imaging (MRI) systems and in particular, to an apparatus and method for providing forced airflow to a surface of a gradient coil in a magnet assembly of a MRI system.

BACKGROUND OF THE INVENTION

MRI scanners, which are used in various fields such as medical diagnostics, typically use a computer to create images based on the operation of a magnet, a gradient coil assembly, and a radio frequency coil(s). The magnet creates a uniform main magnetic field that makes nuclei, such as hydrogen atomic nuclei, responsive to radio frequency excitation. The gradient coil assembly imposes a series of pulsed, spatial-gradient magnetic fields upon the main magnetic field to give each point in the imaging volume a spatial identity corresponding to its unique set of magnetic fields during the imaging pulse sequence. The radio frequency coil creates an excitation frequency pulse that temporarily creates an oscillating transverse magnetization that is detected by the radio frequency coil and used by the computer to create the image. An image may be created using one of many known reconstruction techniques. Typically, in a cylindrical MRI system, there is a radio frequency coil and a gradient coil assembly within the magnet.

During a patient scan, the gradient coil(s) of the gradient coil assembly that produce the magnetic field gradients dissipate large amounts of heat. The heat produced by the gradient coils may be removed from the gradient assembly by liquid filled cooling tubes positioned at a given distance from the heat conductors. A liquid coolant, such as water, ethylene or a propylene glycol mixture, absorbs heat from the gradient coils as it is pumped through the cooling tubes and transports the heat to a remote heat exchange/water chiller. Heat is then ejected to the atmosphere by way of the heat exchange/chiller.

With modem high power MRI imaging sequences, however, it is increasingly difficult to remove the heat generated by the gradient coils. This, in turn, increases the risk of MRI patients becoming over-heated. Therefore, there is a need to provide additional cooling to gradient coils in an MRI scanner. In particular, there is a need to provide an apparatus and method for providing forced-air cooling to a gradient coil. It would be advantageous to provide an apparatus and method to provide forced airflow to a surface of a gradient coil to cool the gradient coil. The forced air-cooling may be provided by itself or in addition to a liquid cooling system or other cooling system.

BRIEF DESCRIPTION OF THE INVENTION

In accordance with an embodiment, an apparatus for providing forced airflow to a surface of a cylindrical gradient coil in a cylindrical magnet assembly including a cylindrical magnet and a first annular gap between the gradient coil and the magnet, the gradient coil mounted inside the magnet, includes a first manifold tube having an annular shape and located in the first annular gap between the gradient coil and the magnet, the first manifold tube having at least one inlet on a first side of the first manifold tube and a plurality of outlet holes on a second side of the first manifold tube. The apparatus also includes an air source coupled to at least one inlet of the first manifold tube and configured to provide airflow to the first manifold tube.

In accordance with another embodiment, an apparatus for providing forced airflow to a surface of a cylindrical gradient coil in a cylindrical magnet assembly including a cylindrical RF coil mounted inside the gradient coil and an annular gap between the gradient coil and the RF coil, includes a manifold tube having an annular shape and located in the annular gap between the gradient coil and the RF coil, the manifold tube having at least one inlet on a first side of the manifold tube and a plurality of outlet holes on a second side of the manifold tube. The apparatus also includes an air source coupled to at least one inlet of the manifold tube and configured to provide airflow to the manifold tube.

In accordance with another embodiment, a method for providing forced airflow to a surface of a cylindrical gradient coil in a cylindrical magnet assembly including a cylindrical magnet and a cylindrical RF coil, includes providing a manifold tube in an annular gap adjacent to the gradient coil, the manifold tube comprising at least one inlet and a plurality of outlet holes and supplying an airflow to the manifold tube via the at least one inlet.

DESCRIPTION OF THE DRAWINGS

The invention will become more fully understood from the following detailed description, taken in conjunction with the accompanying drawings, wherein like reference numerals refer to like parts, in which.

DETAILED DESCRIPTION

Figure 1:
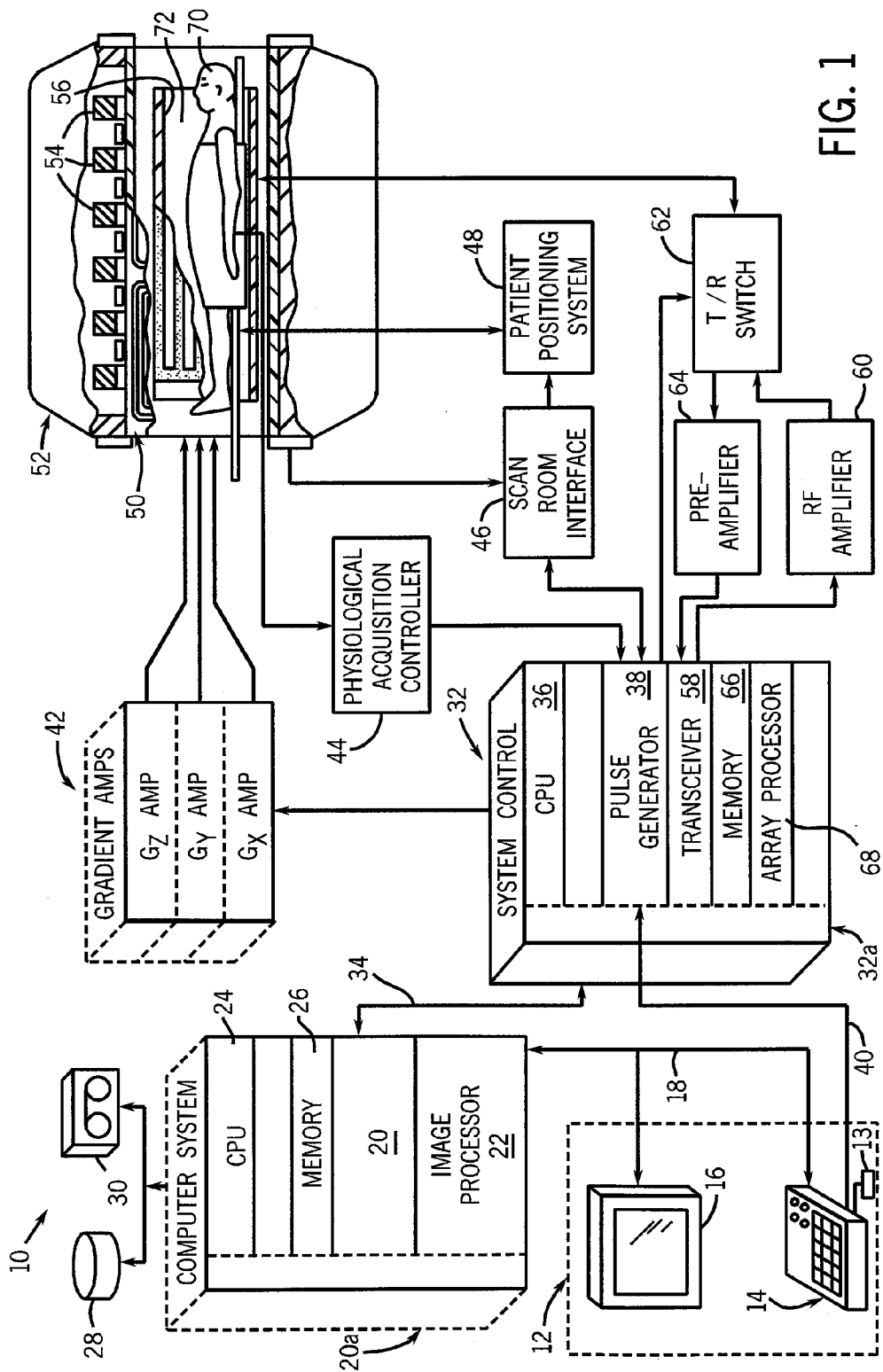
FIG. 1 is a schematic block diagram of a magnetic resonance imaging system in accordance with an exemplary embodiment.

FIG. 1 is a schematic block diagram of a magnetic resonance imaging system in accordance with an exemplary embodiment. The operation of MRI system 10 is controlled from an operator console 12 that includes a keyboard or other input device 13, a control panel 14, and a display 16. The console 12 communicates through a link 18 with a separate computer system 20 that enables an operator to control the production and display of images on the screen 16. The computer system 20 includes a number of modules that communicate with each other through a backplane 20a. These include an image processor module 22, a CPU module 24 and a memory module 26. Memory module 26 may be, for example, a frame buffer for storing image data arrays as known in the art. The computer system 20 is linked to disk storage 28 and tape drive 30 for storage of image data and programs, and communicates with a separate control system 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 that connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42 to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. The pulse generator module 38 connects to a scan room interface circuit 46 that receives signals from various sensors associated with the condition of the patient and the magnet system. It is also through the scan room interface circuit 46 that a patient positioning system 48 receives commands to move the patient to the desired position for the scan.

Figure 2:
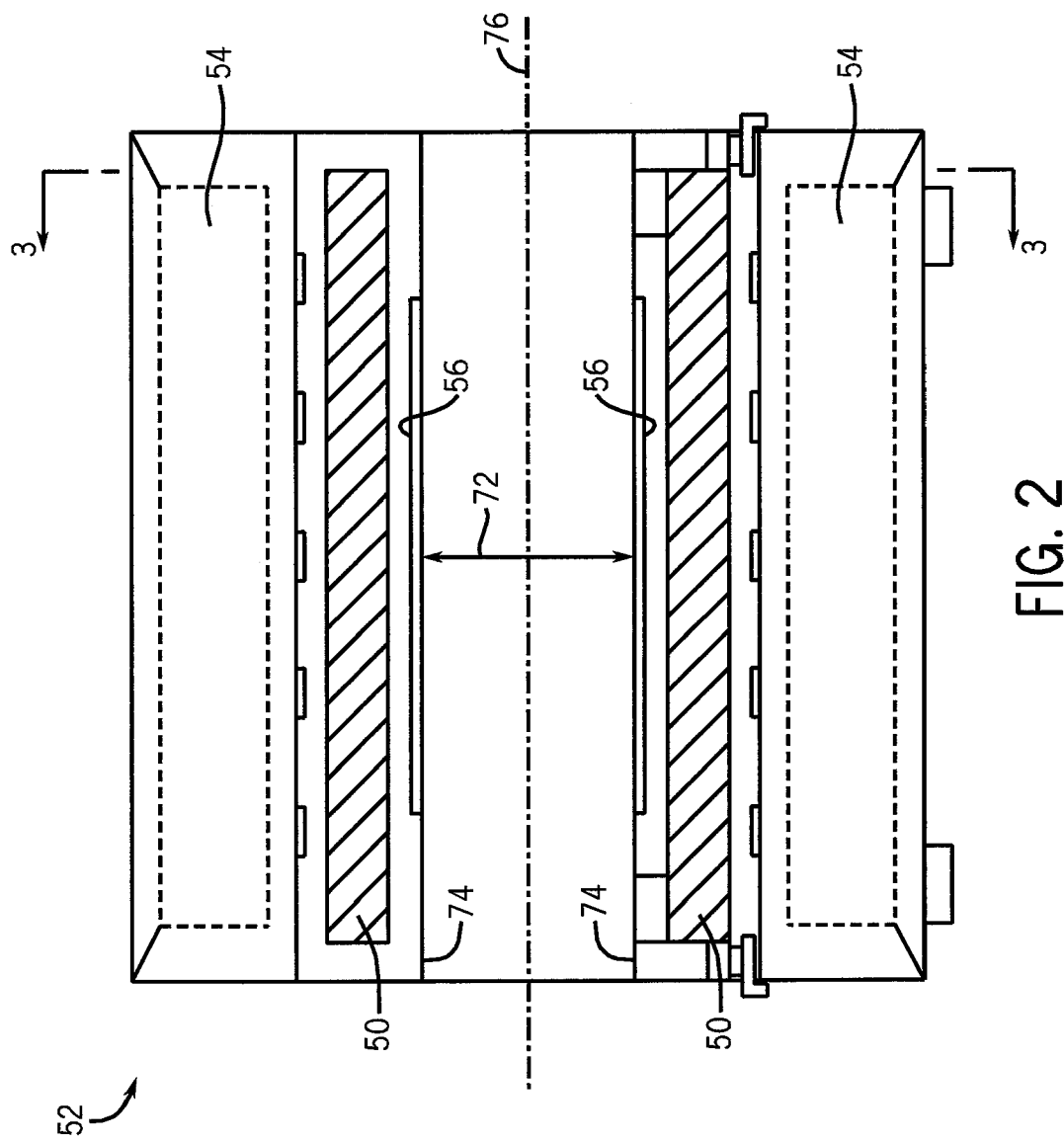
FIG. 2 is a schematic diagram of a cross-sectional side-elevation view of a magnet assembly in accordance with an exemplary embodiment.

The gradient waveforms produced by the pulse generator module 38 are applied to the gradient amplifier system 42 having Gx, Gy and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 that includes a polarizing magnet 54 and a whole-body RF coil 56. A patient or imaging subject 70 may be positioned within a cylindrical imaging volume 72 of the magnet assembly 52. FIG. 2 is a schematic diagram of a cross-sectional side-elevation view of a magnet assembly in accordance with an exemplary embodiment. The cylindrical imaging volume 72 is surrounded by a patient bore tube 74. A patient or imaging subject (not shown) may be inserted into the magnet assembly 52 along a center axis 76 on a patient table or cradle (not shown). Center axis 76 is aligned along the tube axis of the magnet assembly 52 parallel to the direction of the $B_o$ magnetic field generated by the magnet 54. RF coil 56 is used to apply a radio frequency magnetic field pulse to a patient or subject and to receive MRI information back from the subject, as is well known in the art of MR imaging. Gradient coil assembly 50 generates time dependent gradient magnetic field pulses in a known manner.

Figure 3:
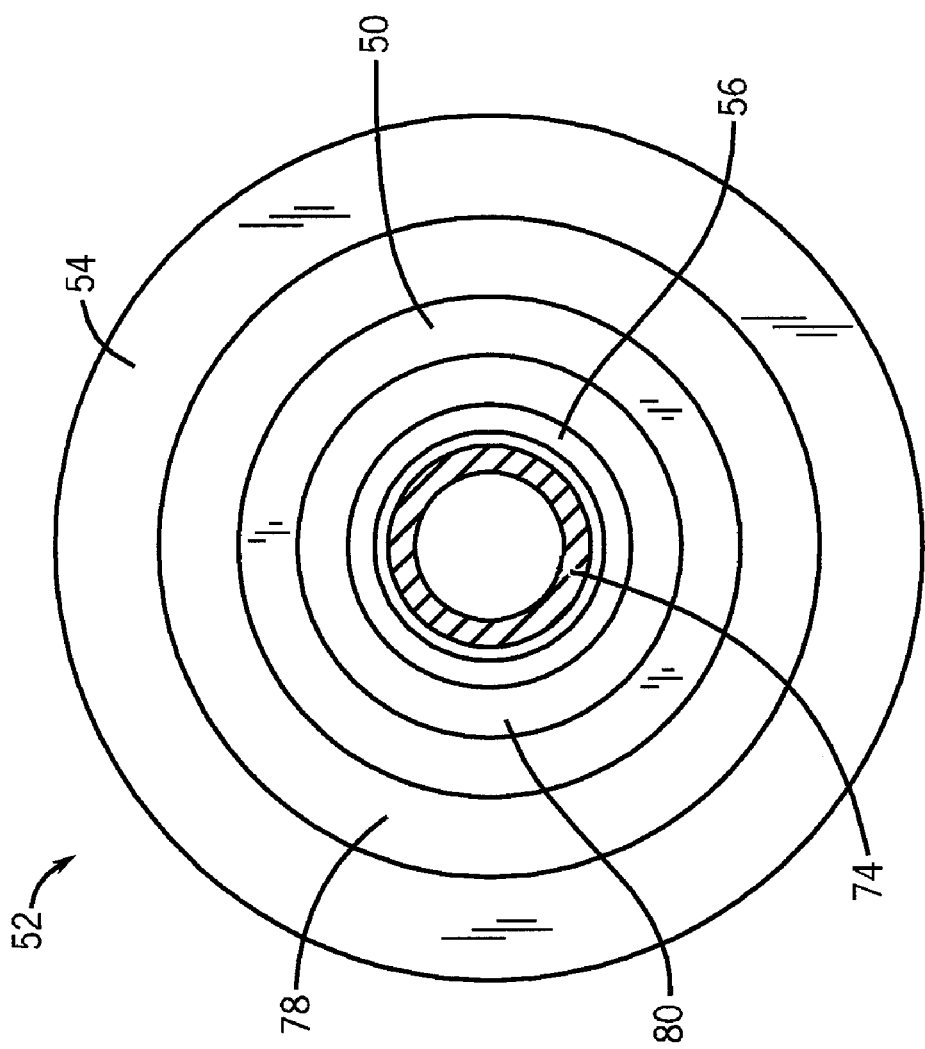
FIG. 3 is a schematic diagram of a cross-sectional view of the magnet assembly of FIG. 2 taken along line 3-3 of FIG. 2 in accordance with an embodiment.

Magnet assembly 52 is cylindrical and annular in shape. FIG. 3 is a schematic diagram of a cross-sectional view of the main components of the magnet assembly of FIG. 2 taken along the line 3-3 of FIG. 2 in accordance with an embodiment. As mentioned, the main components of the magnet assembly 52 are superconducting magnet 54, gradient coil assembly 50 and RF coil 56. Various other elements, such as supports, suspension members, end caps, brackets, etc. are omitted from FIG. 3 for clarity. RF coil 56 is mounted on an outer surface of the patient bore tube 74 and mounted inside the gradient coil assembly 50. The gradient coil assembly 50 is disposed around the RF coil 56 in a spaced apart coaxial relationship and the gradient coil assembly 50 circumferentially surrounds the RF coil 56. Gradient coil 50 is mounted inside magnet 54 and is circumferentially surrounded by magnet 54. The arrangement of the various cylinders in magnet assembly 52 include two annular spaces or gaps. A first annular space or gap 78 is located between the magnet 54 and the gradient coil assembly 50. A second annular space or gap 80 is located between the gradient coil assembly 50 and the RF coil 56.

Returning to FIG. 1, a transceiver module 58 in the system control 32 produces pulses that are amplified by an RF amplifier 60 and coupled to the RF coils 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered and digitized in the receiver section of the transceiver 58. The transmit/receive switch 62 is controlled by a signal from the pulse generator module 38 to electrically connect the RF amplifier 60 to the RF coil 56 during the transmit mode and to connect the preamplifier 64 to the coil during the receive mode. The transmit/receive switch 62 can also enable a separate RF coil (for example, a surface coil) to be used in either the transmit or receive mode.

The MR signals picked up by the RF coil are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on display 16.

Figure 4:
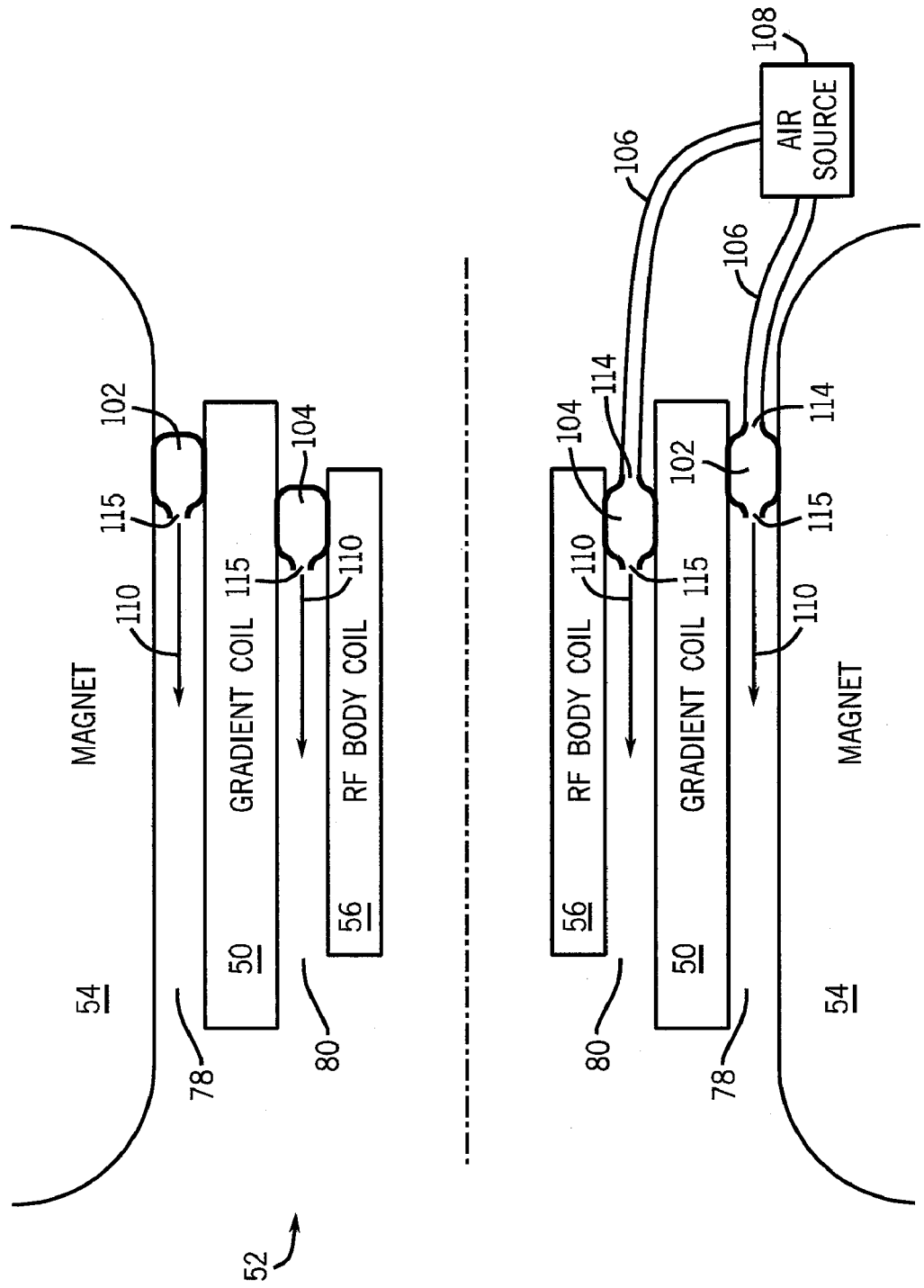
FIG. 4 is a schematic diagram of a cross-sectional side view of a magnetic assembly including an apparatus for providing forced airflow to a surface of a gradient coil in accordance with an embodiment.

During operation, the gradient coil assembly 50 generates a large amount of heat. The magnet assembly 52 may include a liquid cooling structure (not shown) as well known in the art. In addition to a liquid cooling structure or as an alternative to a liquid cooling structure, an apparatus to provide forced airflow to the gradient coil 50 may be used to provide cooling to the gradient coil 50. FIG. 4 is a schematic diagram of a cross-sectional side view of a magnet assembly including an apparatus for providing forced airflow to a surface of a gradient coil in accordance with an embodiment. As discussed above with respect to FIG. 3, the magnet assembly 52 includes two annular spaces or gaps. A first annular gap 78 is located between the magnet 54 and the gradient coil assembly 50. A second annular gap 80 is located between the gradient coil assembly 50 and the RF coil 56. A first annular manifold tube 102 may be placed in the first annular gap 78 or a second annular manifold tube 104 may be placed in the second annular gap 80. In one embodiment, the magnet assembly 52 may include both the first manifold tube 102 and the second manifold tube 104 as shown in FIG. 4. In alternative embodiments, only one manifold tube, i.e., either in the first annular gap 78 or in the second annular gap 80, may be used in the magnet assembly 52.

Figure 5:
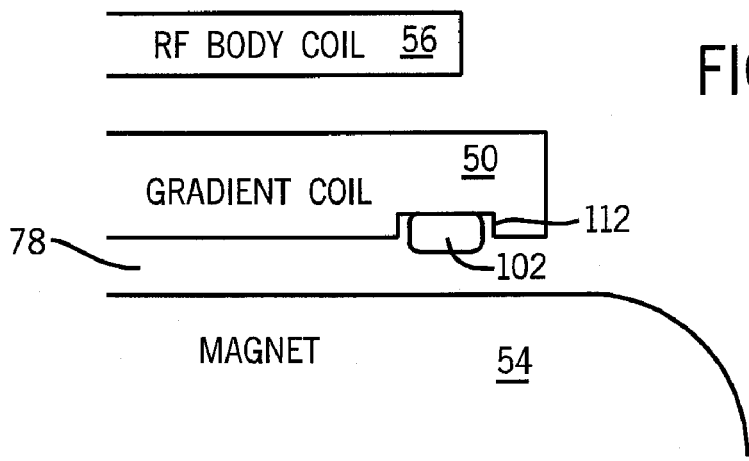
FIG. 5 is a schematic diagram of a cross-sectional side view of a magnet assembly including a manifold tube in accordance with an embodiment.

The first manifold tube 102 is configured to provide forced airflow to an outside surface of the gradient coil 50. Manifold tube 102 is an annular shape with a width less than the length of the gradient coil 50 cylinder. Preferably, manifold tube 102 is made of an elastomeric material such as natural or synthetic rubber Manifold tube 102 is placed around the outside diameter of the gradient coil 50 at one end of the gradient coil 50 cylinder. In one embodiment, the manifold tube 102 is stretched around the outside diameter of the gradient coil 50 during manufacture of the gradient coil 50. In FIG. 4, manifold tube 102 is illustrated as expanded with air. In one embodiment, a recess 112 may be provided on the gradient coil assembly 50 as shown in FIG. 5. Accordingly, manifold tube 102 may be located in the recess 112. In FIG. 5, manifold tube 102 is not expanded (i.e., air flow is not being provided) and lies flat against the outside surface of the gradient coil 50.

Figure 6:
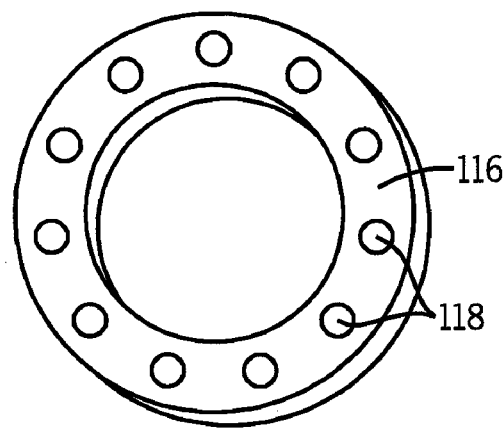
FIG. 6 is a schematic diagram of a perspective view of a manifold tube in accordance with an embodiment.

Returning to FIG. 4, manifold tube 102 includes at least one inlet 114 on a first side of the manifold tube 102. Inlet 114 is coupled to an air source 108 by, for example, a length of hose 106. Air source 108 may be a known source of air such as a blower. Manifold tube 102 also includes a plurality of outlet holes 115 on a second side of the manifold tube 102. Preferably, the outlet holes 115 are on the opposite side of the manifold tube 102 from the inlet 114. FIG. 6 is a schematic diagram of a perspective view of a manifold tube in accordance with an embodiment. Manifold tube 116 includes a plurality of outlet holes 118 on one side of the manifold tube 116. As mentioned above, the opposite side (not shown) of the manifold tube 116 includes at least one inlet (not shown) that may be coupled to an air source (not shown). An exemplary number of outlet holes 118 is shown in FIG. 6. In alternative embodiments, different numbers and sizes of outlet holes 118 may be provided on the manifold tube 116. Preferably, the size and number of outlet holes 118 are optimized so that the manifold tube 116 expands properly and provides sufficient airflow, e.g., one quarter inch diameter holes every one inch.

Figure 7:
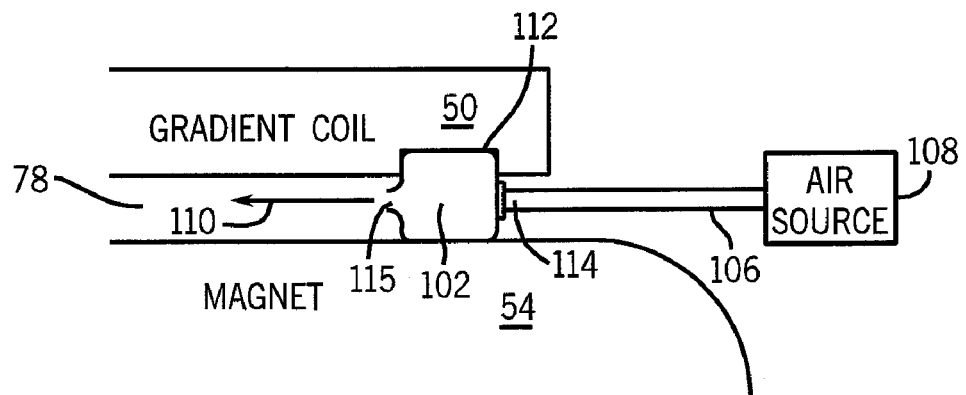
FIG. 7 is a schematic diagram of a cross-sectional side view of a manifold tube placed in an annular gap of a magnet assembly in accordance with an embodiment.

Returning to FIG. 4, the outlet holes 115 of manifold tube 102 are configured to duct airflow 110 along the annular gap 78 between the gradient coil 50 and the superconducting magnet 54. FIG. 7 is a schematic diagram of a cross-sectional side view of a manifold tube placed in an annular gap of a magnet assembly in accordance with an embodiment. When the air source 108 is turned on, the manifold tube 102 will expand in size as the internal air pressure in the manifold tube 102 increases. Air from the air source 108 is provided to manifold tube 102 via a hose 106 (or other appropriate connection) and inlet 114. When the manifold tube 102 expands to a certain size, the manifold tube 102 will block or fill the annular gap 78 between the gradient coil 50 and the magnet 54. Once the manifold tube 102 has expanded to fill the annular gap 78, the air in the manifold tube 102 is forced to flow through the outlet holes 115 to the annular gap 78 and along the length of the gradient coil 50 and magnet 54 cylinders. The direction of airflow is shown by arrow 110. The airflow 110 moves along the length of the gradient coil 50 cylinder and is expelled at the opposite end of the annular gap 78 to the atmosphere. The air absorbs heat from the gradient coil 50 as it passes through the annular gap 78 and along the outside surface of the gradient coil 50. Accordingly, the airflow 110 acts to cool the gradient coil 50. When expanded, manifold tube 102 may also act to reduce acoustic noise emitted by the magnet assembly by blocking one end of the annular gap 78. As mentioned above, when the air source 108 is turned off, the manifold tube 102 is not expanded and lies against the gradient coil 50, as shown, for example, in FIG. 5.

Referring again to FIG. 4, a second annular manifold tube may 104 may be placed in a second annular gap 80 between the gradient coil 50 and the RF coil 56. The second manifold tube 104 is configured to provide forced airflow to an inside surface of the gradient coil 50. Manifold tube 104 is an annular shape with a width less then the length of the RF coil 56 cylinder. Preferably, manifold tube 104 is made of an elastomeric material. Manifold tube 104 is placed around the outside diameter of the RF coil 56 at one end of the RF coil 56 cylinder. In one embodiment, the manifold tube 104 is stretched around the outside diameter of the RF coil 56 during manufacture of the RF coil 56. In FIG. 4, manifold tube 104 is illustrated as expanded with air. In one embodiment, a recess (not shown) may be provided on the RF coil 56. Accordingly, manifold tube 104 may be located in the recess. When not expanded, manifold tube 104 lies flat against the RF coil 56 surface.

Manifold tube 104 includes at least one inlet 114 on a first side of the manifold tube 104. Inlet 114 is coupled to air source 108 by, for example, a length of hose 106. Manifold tube also includes a plurality of outlet holes 115 on a second side of the manifold tube 104. Preferably, outlet holes 115 are on the opposite side of the manifold tube 104 from the inlet 114. The outlet holes 115 of manifold tube 104 are configured to duct airflow 110 along the annular gap 80 between the gradient coil 50 and the RF coil 56. When air source 108 is turned on, the manifold tube 104 will expand in size as the internal air pressure in manifold tube 104 increases. Air from the air source 108 is provided to manifold tube via a hose 106 (or other appropriate connection) and inlet 114. When the manifold tube 104 expands to a certain size, the manifold tube 104 will block or fill the annular gap 80 between the gradient coil 50 and the RF coil 56. Once the manifold tube 104 has expanded to fill the annular gap 80, the air in the manifold tube 104 is forced to flow through the outlet holes 115 to the annular gap 80 and along the length of the gradient coil 50 and RF coil 56. The direction of airflow is shown by arrow 110. The airflow 110 moves along the length of the gradient coil 50 cylinder and is expelled at the opposite end of the annular gap 80 to the atmosphere. The air absorbs heat from the gradient coil 50 as it passes through the annular gap 80 and along the inside surface of the gradient coil 50. Accordingly, the airflow 110 acts to cool the gradient coil 50. When expanded, manifold tube 104 may also act to reduce acoustic noise emitted by the magnet assembly by blocking one end of the annular gap 80.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims. The order and sequence of any process or method steps may be varied or re-sequenced according to alternative embodiments.

Many other changes and modifications may be made to the present invention without departing from the spirit thereof. The scope of these and other changes will become apparent from the appended claims.

We claim:

1. An apparatus for providing forced airflow to a surface of a cylindrical gradient coil in a cylindrical magnet assembly including a cylindrical magnet and a first annular gap between the gradient coil and the magnet, the gradient coil mounted inside the magnet, the apparatus comprising:
   a first manifold tube having an annular shape and located in the first annular gap between the gradient coil and the magnet, the first manifold tube comprising:
      at least one inlet on a first side of the first manifold tube; and
      a plurality of outlet holes on a second side of the first manifold tube;
      wherein the first manifold tube is mounted around an outside diameter of the gradient coil at an end of the cylindrical gradient coil and the first manifold tube is in contact with an outside surface of the gradient coil; and
   an air source coupled to at least one inlet of the first manifold tube and configured to provide airflow to the first manifold tube.

2. An apparatus according to claim 1, wherein the first manifold tube is configured to expand in the first annular gap when airflow is provided by the air source.

3. An apparatus according to claim 1, wherein the first manifold tube is configured to duct airflow through the plurality of outlet holes to the first annular gap and along an outside surface of the gradient coil.

4. An apparatus according to claim 1, wherein the magnet is a superconducting magnet.

5. An apparatus according to claim 1, wherein the first manifold tube is composed of an elastomeric material.

6. An apparatus according to claim 1, wherein the cylindrical magnet assembly further comprises a cylindrical RF coil mounted inside the gradient coil and a second annular gap between the gradient coil and the RF coil, the apparatus further comprising:
   a second manifold tube having an annular shape and located in the second annular gap between the gradient coil and the RF coil, wherein the second manifold tube is coupled to the air source.

7. An apparatus according to claim 6, wherein the second manifold tube comprises:
   at least one inlet on a first side of the second manifold tube, the at least one inlet coupled to the air source; and
   a plurality of outlet holes on a second side of the second manifold tube.

8. An apparatus according to claim 7, wherein the second manifold tube is configured to expand in the second annular gap when airflow is provided by the air source.

9. An apparatus according to claim 7, wherein the second manifold tube is configured to duct airflow through the plurality of outlet holes to the second annular gap and along an inside surface of the gradient coil.

10. An apparatus according to claim 6, wherein the second manifold tube is mounted around an outside diameter of the RF coil at an end of the cylindrical RF coil and the second manifold tube is in contact with an outside surface of the RF coil.

11. An apparatus for providing forced airflow to a surface of a cylindrical gradient coil in a cylindrical magnet assembly including a cylindrical RF coil mounted inside the gradient coil and an annular gap between the gradient coil and the RF coil, the apparatus comprising:
   a manifold tube having an annular shape and located in the annular gap between the gradient coil and the RF coil, the manifold tube comprising:
      at least one inlet on a first side of the manifold tube; and
      a plurality of outlet holes on a second side of the manifold tube; and
   an air source coupled to at least one inlet of the manifold tube and configured to provide airflow to the manifold tube.

12. An apparatus according to claim 11, wherein the manifold tube is mounted around an outside diameter of the RF coil at an end of the cylindrical RF coil and the manifold tube is in contact with an outside surface of the RF coil.

13. An apparatus according to claim 11, wherein the manifold tube is configured to expand in the annular gap when airflow is provided by the air source.

14. An apparatus according to claim 11, wherein the manifold tube is configured to duct airflow through the plurality of outlet holes to the annular gap and along an inside surface of the gradient coil.

15. An apparatus according to claim 11, wherein the manifold tube is composed of an elastomeric material.

16. An apparatus according to claim 11, wherein the magnet is a superconducting magnet.

17. A method for providing forced airflow to a surface of a cylindrical gradient coil in a cylindrical magnet assembly including a cylindrical magnet and a cylindrical RF coil, the method comprising:
   providing a manifold tube in an annular gap between the gradient coil and the magnet, the manifold tube mounted around and in contact with an outside diameter of the gradient coil, the manifold tube comprising at least one inlet and a plurality of outlet holes; and
   supplying an airflow to the manifold tube via the at least one inlet;
   wherein the manifold tube is configured to duct the airflow through the plurality of outlet holes to the annular gap and along an outside surface of the gradient coil.

18. A method for providing forced airflow to a surface of a cylindrical gradient coil in a cylindrical magnet assembly including a cylindrical magnet and a cylindrical RF coil, the method comprising:
   providing a manifold tube in an annular gap adjacent to the gradient coil, the manifold tube comprising at least one inlet and a plurality of outlet holes; and
   supplying an airflow to the manifold tube via the at least one inlet;
   wherein the annular gap is between the gradient coil and the RF coil and the manifold tube is configured to duct airflow through the plurality of outlet holes to the annular gap and along an inside surface of the gradient coil.

* * * * *